United States Patent
Wasaki et al.

(10) Patent No.: US 7,423,520 B2
(45) Date of Patent: Sep. 9, 2008

(54) NOISE SUPPRESSING CIRCUIT

(75) Inventors: Masaru Wasaki, deceased, late of Ichihara (JP); by Hitomi Wasaki, legal representative, Ichihara (JP); Yoshihiro Saitoh, Tokyo (JP)

(73) Assignee: TDK Corporation, Tokyo (JP)

( * ) Notice: Subject to any disclaimer, the term of this patent is extended or adjusted under 35 U.S.C. 154(b) by 354 days.

(21) Appl. No.: 10/547,449

(22) PCT Filed: Mar. 2, 2004

(86) PCT No.: PCT/JP2004/002545

§ 371 (c)(1),
(2), (4) Date: Aug. 30, 2005

(87) PCT Pub. No.: WO2004/079902

PCT Pub. Date: Sep. 16, 2004

(65) Prior Publication Data

US 2006/0158814 A1    Jul. 20, 2006

(30) Foreign Application Priority Data

Mar. 5, 2003    (JP) .............................. 2003-058879

(51) Int. Cl.
*G05B 11/01*    (2006.01)
*H04B 15/00*    (2006.01)
(52) U.S. Cl. ........................ 340/310.13; 340/310.11; 375/285
(58) Field of Classification Search ............ 363/34–41; 340/310.3, 310.05, 310.11–310.18; 375/220, 375/254, 343, 479, 285
See application file for complete search history.

(56) References Cited

U.S. PATENT DOCUMENTS

| 2,043,416 | A  | 6/1936  | Lueg |
| 4,475,214 | A  | 10/1984 | Gutleber |
| 4,783,817 | A  | 11/1988 | Hamada et al. |
| 4,903,006 | A  | 2/1990  | Boomgaard |
| 5,831,842 | A  | 11/1998 | Ogasawara et al. |
| 5,844,789 | A  | 12/1998 | Wynn |
| 5,977,853 | A  | 11/1999 | Ooi et al. |
| 6,313,738 | B1 | 11/2001 | Wynn |
| 6,317,031 | B1 | 11/2001 | Rickard |
| 6,329,905 | B1 | 12/2001 | Cunningham |
| 6,373,674 | B1 | 4/2002  | Sugiura et al. |
| 6,441,723 | B1 | 8/2002  | Mansfield, Jr. et al. |

(Continued)

FOREIGN PATENT DOCUMENTS

EP    1 553 699 A1    7/2005

(Continued)

*Primary Examiner*—Rajnikant B Patel
(74) *Attorney, Agent, or Firm*—Oliff & Berridge, PLC

(57) ABSTRACT

A noise suppressing circuit comprises: windings (W11, W12) inserted to conductor lines (3, 4) at respective points (P11a, P11b) and coupled to each other through a magnetic core (11); a winding (W13) coupled to the windings (W11, W12) through the core (11); capacitors (12, 13) having ends connected to the conductor lines (3, 4) at respective points (P12a, P12b) and the other ends connected to an end of the winding (W13); and windings (W14, W15) inserted to conductor lines (3, 4) at respective points (P13a, P13b) and coupled to each other through a magnetic core (14). These components reduce common mode noise. Capacitors (16, 17) reduce normal mode noise in cooperation with leakage inductances produced by the windings (W14, W15).

10 Claims, 9 Drawing Sheets

U.S. PATENT DOCUMENTS 6,667,685 B2 * 12/2003 Wasaki et al. ............... 375/285
2002/0063474 A1   5/2002 Wasaki et al.

FOREIGN PATENT DOCUMENTS

| JP | A-53-054447 | 5/1978 |
| --- | --- | --- |
| JP | U-58-022719 | 2/1983 |
| JP | A-63-215206 | 9/1988 |
| JP | A-02-078327 | 3/1990 |
| JP | A-02-206360 | 8/1990 |
| JP | A-02-241233 | 9/1990 |
| JP | A-04-140910 | 5/1992 |
| JP | A-04-254308 | 9/1992 |
| JP | A-05-153782 | 6/1993 |
| JP | A-05-219758 | 8/1993 |
| JP | A-07-022886 | 1/1995 |
| JP | A-07-022905 | 1/1995 |
| JP | A-07-115339 | 5/1995 |
| JP | A-08-098536 | 4/1996 |
| JP | A-08-213242 | 8/1996 |
| JP | A-09-046020 | 2/1997 |
| JP | A-09-102723 | 4/1997 |
| JP | A-09-266677 | 10/1997 |
| JP | A-10-094244 | 4/1998 |
| JP | A-10-163046 | 6/1998 |
| JP | A-10-303674 | 11/1998 |
| JP | A-11-154843 | 6/1999 |
| JP | A-11-162756 | 6/1999 |
| JP | A-11-196034 | 7/1999 |
| JP | A-2000-201044 | 7/2000 |
| JP | A-2000-244272 | 9/2000 |
| JP | A-2002-204189 | 7/2002 |
| JP | A-2002-290289 | 10/2002 |
| JP | A-2004-080436 | 3/2004 |

* cited by examiner

NOISE SUPPRESSING CIRCUIT

TECHNICAL FIELD

The present invention relates to a noise suppressing circuit for suppressing noise propagating through conductor lines.

BACKGROUND ART

Power electronics apparatuses such as a switching power supply, an inverter and a lighting circuit of a lighting fixture incorporate a power transformer circuit for transforming power. The power transformer circuit incorporates a switching circuit for transforming a direct current to an alternating current having rectangular waves. Consequently, the power transformer circuit develops a ripple voltage having a frequency equal to the switching frequency of the switching circuit, and noise resulting from the switching operation of the switching circuit. Such a ripple voltage and noise affect other apparatuses. It is therefore required to provide a means for reducing the ripple voltage and noise between the power transformer circuit and the other apparatuses or lines.

LC filters, that is, filters each incorporating an inductance element (an inductor) and a capacitor, are often used as a means for reducing a ripple voltage and noise. The LC filters include a T filter and a π filter, in addition to the one incorporating an inductance element and a capacitor. A typical noise filter for suppressing electromagnetic interference (EMI) is a type of LC filters, too. A typical EMI filter is made up of a combination of discrete elements such as a common mode choke coil, a normal mode choke coil, an X capacitor, and a Y capacitor.

Recently, power-line communications have been developed as a potential communications technique used for creating communications networks in homes. Through the power-line communications, high-frequency signals are superimposed on a power line to perform communications. When the power-line communications are performed, noise emerges on the power line because of the operations of various electric and electronic apparatuses connected to the power line, which causes a reduction in quality of communications, such as an increase in error rate. It is therefore required to provide a means for reducing noise on the power line. Moreover, it is required for the power-line communications to prevent communications signals on an indoor power line from leaking to an outdoor power line. The LC filters are used as a means for reducing noise on the power line and for preventing communications signals on the indoor power line from leaking to the outdoor power line as thus described, too.

There are two types of noise propagating along two conductor lines: one is normal mode noise that creates a potential difference between the two conductor lines, while the other is common mode noise that propagates along the two conductor lines with identical phases.

In many cases there exist both normal mode noise and common mode noise on an actual conductor line although the proportions thereof vary. Noise suppressing circuits capable of reducing both normal mode noise and common mode noise are therefore desired.

The Published Unexamined Japanese Patent Application Heisei 8-213242 (1996) discloses a choke coil for reducing normal mode noise and common mode noise. The choke coil comprises a pair of windings, and first and second magnetic cores around which the pair of windings are wound. The first magnetic core is made of a low-permeability material while the second magnetic core is made of a high-permeability material. A specific gap is created between the first and second magnetic cores. In this choke coil, when a current of common mode is fed through the pair of windings, a magnetic flux produced by the windings attenuates in the second magnetic core, and common mode noise is thereby reduced. When a current of normal mode is fed through the pair of windings in the choke coil, a magnetic flux produced by the windings attenuates in the first magnetic core, and normal mode noise is thereby reduced.

The Published Unexamined Japanese Patent Application Heisei 9-46020 (1997) discloses a noise filter for reducing normal mode noise and common mode noise. The noise filter comprises a coil, an X capacitor and a Y capacitor all of which are combined.

The Published Unexamined Japanese Patent Application Heisei 2-206360 (1990) discloses a power supply circuit comprising a filter circuit for normal mode noise and a filter circuit for common mode noise. The filter circuit for normal mode noise incorporates two coils inserted to two conductor lines, respectively, and an X capacitor connecting the two coils to each other. The filter circuit for common mode noise incorporates two coils inserted to two conductor lines, respectively, and a Y capacitor connected to the two coils.

The Published Unexamined Japanese Patent Application Heisei 9-102723 (1997) discloses a line filter using a transformer. The line filter comprises the transformer and a filter circuit. The transformer incorporates a secondary winding inserted to one of two conductor lines for transmitting power from an alternating power supply to a load. The filter circuit has two inputs connected to ends of the alternating power supply, and two outputs connected to ends of a primary winding of the transformer. In the line filter, the filter circuit extracts noise components from the supply voltage and supplies the noise components to the primary winding of the transformer, so that the noise components are subtracted from the supply voltage on the conductor line to which the secondary winding of the transformer is inserted.

The conventional LC filters have a problem that, since the filters have a specific resonant frequency determined by the inductance and the capacitance, a desired amount of attenuation is obtained only within a narrow frequency range.

It is required for a filter inserted to a conductor line for power transfer that a desired characteristic be obtained while a current for power transfer flows and that a measure be taken against an increase in temperature. Therefore, a ferrite core having a gap is typically employed as a magnetic core in an inductance element of a filter for a power transformer circuit. However, such an inductance element has a problem that the characteristic thereof becomes close to the characteristic of an air-core inductance element, so that the inductance element is increased in size to implement a desired characteristic.

A typical EMI filter incorporates a filter for reducing normal mode noise and a filter for reducing common mode noise. As a result, the EMI filter has a problem similar to that of the above-mentioned LC filter and has a problem that the number of components is increased and the EMI filter is thereby increased in dimensions.

The choke coil disclosed in the Published Unexamined Japanese Patent Application Heisei 8-213242 is designed such that normal mode noise and common mode noise are reduced only by the cores and the windings. Therefore, it is difficult to effectively suppress common mode noise and normal mode noise in a wide range of frequencies in this choke coil.

The noise filter disclosed in the Published Unexamined Japanese Patent Application Heisei 9-46020 is designed such that normal mode noise is reduced only by the X capacitor while common mode noise is reduced only by the Y capacitor and the coil. Therefore, it is difficult to effectively suppress common mode noise and normal mode noise in a wide range of frequencies in this noise filter.

The filter circuit disclosed in the Published Unexamined Japanese Patent Application Heisei 2-206360 comprises the filter circuit for normal mode noise and the filter circuit for common mode noise. As a result, the filter circuit has a problem that the number of components is increased and the filter circuit is thereby increased in dimensions, like the above-mentioned typical EMI filter.

The line filter disclosed in the Published Unexamined Japanese Patent Application Heisei 9-102723 is capable of reducing normal mode noise but not capable of reducing common mode noise.

DISCLOSURE OF THE INVENTION

It is an object of the invention to provide a noise suppressing circuit for suppressing common mode noise and normal mode noise in a wide frequency range and for achieving a reduction in size.

A first or second noise suppressing circuit of the invention comprises: a common mode noise suppressing means for suppressing common mode noise propagating through a first conductor line and a second conductor line with identical phases; and a normal mode noise suppressing means for suppressing normal mode noise transmitted through the first and second conductor lines and creating a potential difference between the conductor lines.

In the first noise suppressing circuit of the invention, the common mode noise suppressing means comprises a first detection/injection section and a second detection/injection section that are connected to the first and second conductor lines at different points and connected to each other through a path different from the first and second conductor lines, and that each perform detection of a signal corresponding to common mode noise or injection of an injection signal for suppressing common mode noise.

In the first noise suppressing circuit of the invention, when the first detection/injection section performs the detection of the signal corresponding to the common mode noise, the second detection/injection section injects to the first and second conductor lines the injection signal generated based on the signal detected. When the second detection/injection section performs the detection of the signal corresponding to the common mode noise, the first detection/injection section injects to the first and second conductor lines the injection signal generated based on the signal detected.

In the first noise suppressing circuit of the invention, at least one of the first and second detection/injection sections incorporates two windings inserted to the first and second conductor lines and coupled to each other so as to produce a leakage inductance. The normal mode noise suppressing means incorporates at least one capacitor for a normal mode having an end connected to the first conductor line and the other end connected to the second conductor line, and reducing normal mode noise in cooperation with the leakage inductance produced by the two windings.

In the first noise suppressing circuit of the invention, the first detection/injection section may incorporate: a first winding inserted to the first conductor line at a specific first point; a second winding that is inserted to the second conductor line at a point corresponding to the first point and that suppresses the common mode noise in cooperation with the first winding; and a third winding coupled to the first and second windings. The second detection/injection section may incorporate: a first capacitor for a common mode having an end connected to the first conductor line at a second point different from the first point and having the other end connected to one of ends of the third winding; and a second capacitor for the common mode having an end connected to the second conductor line at a point corresponding to the second point and having the other end connected to the one of the ends of the third winding. In addition, the first and second windings may be coupled to each other so as to produce a leakage inductance.

In the first noise suppressing circuit of the invention, the common mode noise suppressing means may further incorporate a third capacitor for the common mode having an end connected to the one of the ends of the third winding and having the other end grounded.

In the first noise suppressing circuit of the invention, the normal mode noise suppressing means may incorporate two capacitors as the capacitor for the normal mode that are located at positions that sandwich the two windings coupled to each other so as to produce the leakage inductance.

The first noise suppressing circuit of the invention may further comprise a magnetic core around which the two windings coupled to each other so as to produce the leakage inductance are wound, and the core may incorporate: a first magnetic path forming portion that forms a magnetic path allowing a magnetic flux for coupling the two windings to each other to pass; and a second magnetic path forming portion that forms a magnetic path allowing a leakage flux produced by each of the two windings to pass. The second magnetic path forming portion may include a portion made of a high-permeability magnetic material and a portion made of a magnetic material having high saturation flux density, and may form a closed magnetic path.

In the second noise suppressing circuit of the invention, the common mode noise suppressing means comprises: a first detection/injection section and a second detection/injection section that are connected to the first and second conductor lines at different points and connected to each other through a path different from the first and second conductor lines, and that each perform detection of a signal corresponding to common mode noise or injection of an injection signal for suppressing common mode noise; and a peak value reducing section that reduces a peak value of common mode noise and is provided on the first and second conductor lines between the first and second detection/injection sections.

In the second noise suppressing circuit of the invention, when the first detection/injection section performs the detection of the signal corresponding to the common mode noise, the second detection/injection section injects to the first and second conductor lines the injection signal generated based on the signal detected. When the second detection/injection section performs the detection of the signal corresponding to the common mode noise, the first detection/injection section injects to the first and second conductor lines the injection signal generated based on the signal detected.

In the second noise suppressing circuit of the invention, at least one of the first and second detection/injection sections and the peak value reducing section incorporates two windings inserted to the first and second conductor lines and coupled to each other so as to produce a leakage inductance. The normal mode noise suppressing means incorporates at least one capacitor for a normal mode having an end connected to the first conductor line and the other end connected to the second conductor line, and reducing normal mode noise in cooperation with the leakage inductance produced by the two windings.

In the second noise suppressing circuit of the invention, the first detection/injection section may incorporate: a first winding inserted to the first conductor line at a specific first point; a second winding that is inserted to the second conductor line at a point corresponding to the first point and that suppresses the common mode noise in cooperation with the first winding; and a third winding coupled to the first and second windings. The second detection/injection section may incorporate: a first capacitor for a common mode having an end connected to the first conductor line at a second point different from the first point and having the other end connected to one of ends of the third winding; and a second capacitor for the common mode having an end connected to the second conductor line at a point corresponding to the second point and having the other end connected to the one of the ends of the third winding. The peak value reducing section may incorporate: a fourth winding inserted to the first conductor line at a third point located between the first and second points; and a fifth winding that is inserted to the second conductor line at a point corresponding to the third point and coupled to the fourth winding and that reduces the peak value of the common mode noise between the first and second points in cooperation with the fourth winding. In addition, at least one of a pair of the first and second windings and a pair of the fourth and fifth windings may be coupled to each other so as to produce a leakage inductance.

In the second noise suppressing circuit of the invention, the common mode noise suppressing means may further incorporate a third capacitor for the common mode having an end connected to the one of the ends of the third winding and having the other end grounded.

In the second noise suppressing circuit of the invention, the normal mode noise suppressing means may incorporate two capacitors as the capacitor for the normal mode that are located at positions that sandwich the two windings coupled to each other so as to produce the leakage inductance.

The second noise suppressing circuit of the invention may further comprise a magnetic core around which the two windings coupled to each other so as to produce the leakage inductance are wound, and the core may incorporate: a first magnetic path forming portion that forms a magnetic path allowing a magnetic flux for coupling the two windings to each other to pass; and a second magnetic path forming portion that forms a magnetic path allowing a leakage flux produced by each of the two windings to pass. The second magnetic path forming portion may include a portion made of a high-permeability magnetic material and a portion made of a magnetic material having high saturation flux density, and may form a closed magnetic path.

Other and further objects, features and advantages of the invention will appear more fully from the following description.

BEST MODE FOR CARRYING OUT THE INVENTION

Preferred embodiments of the invention will now be described in detail with reference to the accompanying drawings.

First Embodiment

Figure 2:
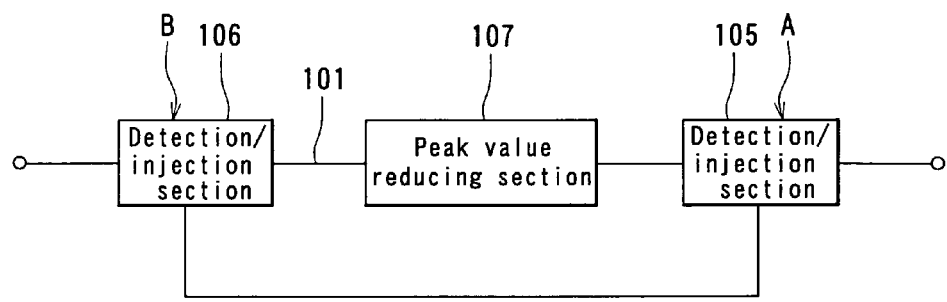
FIG. 2 is a block diagram illustrating the basic configuration of a cancellation-type noise suppressing circuit.

A noise suppressing technique employed in a first embodiment of the invention will now be described. A cancellation-type noise suppressing circuit is used in the embodiment. Reference is made to FIG. 2 to describe a basic configuration and operation of the cancellation-type noise suppressing circuit.

As shown in FIG. 2, the cancellation-type noise suppressing circuit comprises: a first detection/injection section 105 connected to a conductor line 101 at a specific point A; a second detection/injection section 106 connected to the conductor line 101 at a point B different from the point A and connected to the first detection/injection section 105 through a path different from the conductor line 101; and a peak value reducing section 107 provided between the first detection/injection section 105 and the second detection/injection section 106 on the conductor line 101.

Each of the first detection/injection section 105 and the second detection/injection section 106 performs detection of a signal corresponding to noise or injection of an injection signal for suppressing noise. The peak value reducing section 107 reduces a peak value of noise. The first detection/injection section 105 incorporates an inductance element, for example. The reducing section 107 incorporates an impedance element such as an inductance element. The second detection/injection section 106 incorporates a high-pass filter made up of a capacitor, for example.

In the cancellation-type noise suppressing circuit of FIG. 2, if a noise source is located at a point closer to the point B than the point A except a point located somewhere between the points A and B, the detection/injection section 106 detects a signal corresponding to noise on the conductor line 101 at the point B, and generates an injection signal to be injected to the conductor line 101, based on the signal detected, to suppress the noise on the conductor line 101. This injection signal is sent to the detection/injection section 105 through the path different from the conductor line 101. The detection/injection section 105 injects the injection signal to the conductor line 101 such that the signal has a phase opposite to that of the noise on the conductor line 101. As a result, the noise on the conductor line 101 is cancelled out by the injection signal, and noise is suppressed along a portion of the conductor line 101 from the point A onward along the direction of travel of the noise. In the present patent application, noise includes unwanted signals, too.

In the cancellation-type noise suppressing circuit of FIG. 2, if a noise source is located at a point closer to the point A than the point B except a point located somewhere between the points A and B, the detection/injection section 105 detects a signal corresponding to noise on the conductor line 101 at the point A, and generates an injection signal to be injected to the conductor line 101, based on the signal detected, to suppress the noise on the conductor line 101. This injection signal is sent to the detection/injection section 106 through the path different from the conductor line 101. The detection/injection section 106 injects the injection signal to the conductor line 101 such that the signal has a phase opposite to that of the noise on the conductor line 101. As a result, the noise on the conductor line 101 is cancelled out by the injection signal, and noise is suppressed along a portion of the conductor line 101 from the point B onward along the direction of travel of the noise.

The peak value reducing section 107 reduces a peak value of noise passing through the conductor line 101 between the points A and B. As a result, the difference is reduced between the peak value of the noise propagating through the conductor line 101 and the peak value of the injection signal injected to the conductor line 101 through the path different from the conductor line 101.

According to the cancellation-type noise suppressing circuit, it is possible to effectively suppress noise in a wide frequency range.

The cancellation-type noise suppressing circuit may be designed without the peak value reducing section 107. However, if the noise suppressing circuit includes the peak value reducing section 107, it is possible to suppress noise in a wider frequency range as compared with the case where the noise suppressing circuit does not include the peak value reducing section 107.

Figure 3:
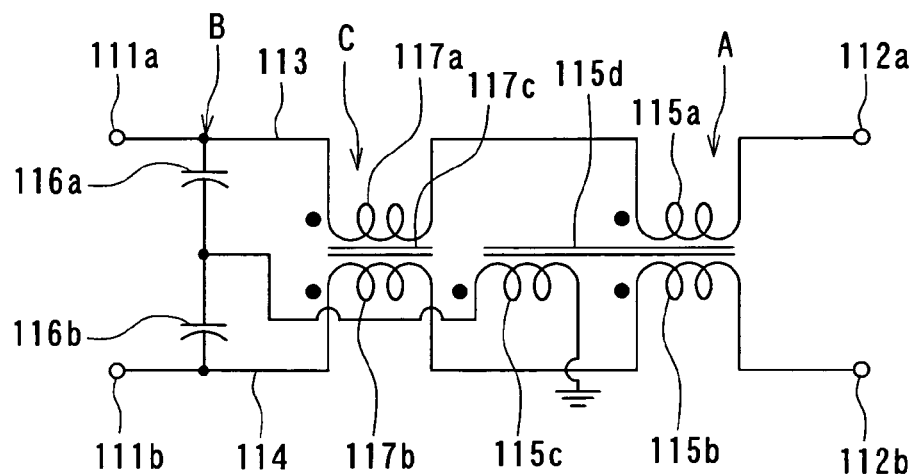
FIG. 3 is a schematic diagram illustrating an example of configuration of the cancellation-type noise suppressing circuit.

Reference is now made to FIG. 3 to describe an example of configuration of the cancellation-type noise suppressing circuit. The noise suppressing circuit of FIG. 3 comprises: a pair of terminals 111a and 111b; another pair of terminals 112a and 112b; a conductor line 113 connecting the terminal 111a to the terminal 112a; and a conductor line 114 connecting the terminal 111b to the terminal 112b. The noise suppressing circuit further comprises: a first winding 115a inserted to the conductor line 113 at the specific point A; a magnetic core 115d; a second winding 115b that is inserted to the conductor line 114 at a point corresponding to the point A and coupled to the first winding 115a through the core 115d, and that suppresses common mode noise in cooperation with the first winding 115a; and a third winding 115c coupled to the first winding 115a and the second winding 115b through the core 115d. The windings 115a and 115b and the core 115d make up a common mode choke coil. That is, the windings 115a and 115b are wound around the core 115d in such directions that, when magnetic fluxes are induced in the core 115d by currents flowing through the windings 115a and 115b when a normal mode current is fed to the windings 115a and 115b, these fluxes are cancelled out by each other. The windings 115a and 115b thereby suppress common mode noise and allow normal mode noise to pass.

The noise suppressing circuit of FIG. 3 further comprises: a capacitor 116a having an end connected to the conductor line 113 at the point B different from the point A and having the other end connected to one of ends of the third winding 115c; and a capacitor 116b having an end connected to the conductor line 114 at a point corresponding to the point B and having the other end connected to the one of the ends of the third winding 115c. The other of the ends of the third winding 115c is grounded. The capacitors 116a and 116b function as a high-pass filter for allowing signals of frequencies equal to or greater than a specific value to pass.

The noise suppressing circuit of FIG. 3 further comprises: a fourth winding 117a inserted to the conductor line 113 at a point C between the points A and B; a magnetic core 117c; and a fifth winding 117b that is inserted to the conductor line 114 at a point corresponding to the point C and coupled to the fourth winding 117a through the core 117c, and that suppresses common mode noise in cooperation with the fourth winding 117a. The windings 117a and 117b and the core 117c make up a common mode choke coil. That is, the windings 117a and 117b are wound around the core 117c in such directions that, when magnetic fluxes are induced in the core 117c by currents flowing through the windings 117a and 117b when a normal mode current is fed to the windings 117a and 117b, these fluxes are cancelled out by each other. The windings 117a and 117b thereby suppress common mode noise and allow normal mode noise to pass.

The windings 115a, 115b and 115c and the core 115d correspond to the first detection/injection section 105 of FIG. 2. The capacitors 116a and 116b correspond to the second detection/injection section 106 of FIG. 2. The windings 117a, 117b and the core 117c correspond to the peak value reducing section 107 of FIG. 2.

The operation of the cancellation-type noise suppressing circuit of FIG. 3 will now be described. First, a case is described in which a noise source is located at a point that is closer to the point B than the point A and other than a point located somewhere between the points A and B. In this case, the capacitors 116a and 116b detect a signal corresponding to common mode noise on the conductor lines 113 and 114 at the point B and the point corresponding to the point B. Furthermore, the capacitors 116a and 116b generate an injection signal having a phase opposite to that of the common mode noise, based on the signal detected. The injection signal is supplied to the third winding 115c. The third winding 115c injects the injection signal to the conductor lines 113 and 114 through the first and second windings 115a and 115b. As a result, common mode noise is suppressed along portions of the conductor lines 113 and 114 from the point A onward along the direction of travel of the common mode noise.

In the cancellation-type noise suppressing circuit of FIG. 3, if a noise source is located at a point that is closer to the point A than the point B and other than a point located somewhere between the points A and B, the third winding 115c detects through the first and second windings 115a and 115b a signal corresponding to common mode noise on the conductor lines 113 and 114 at the point A and the point corresponding to the point A, and generates an injection signal based on the signal detected. This injection signal is injected through the capacitors 116a and 116b at the point B and the point corresponding to the point B, such that the signal has a phase opposite to that of the common mode noise on the conductor lines 113 and 114. As a result, common mode noise is suppressed along portions of the conductor lines 113 and 114 from the point B onward along the direction of travel of the common mode noise.

Figure 4:
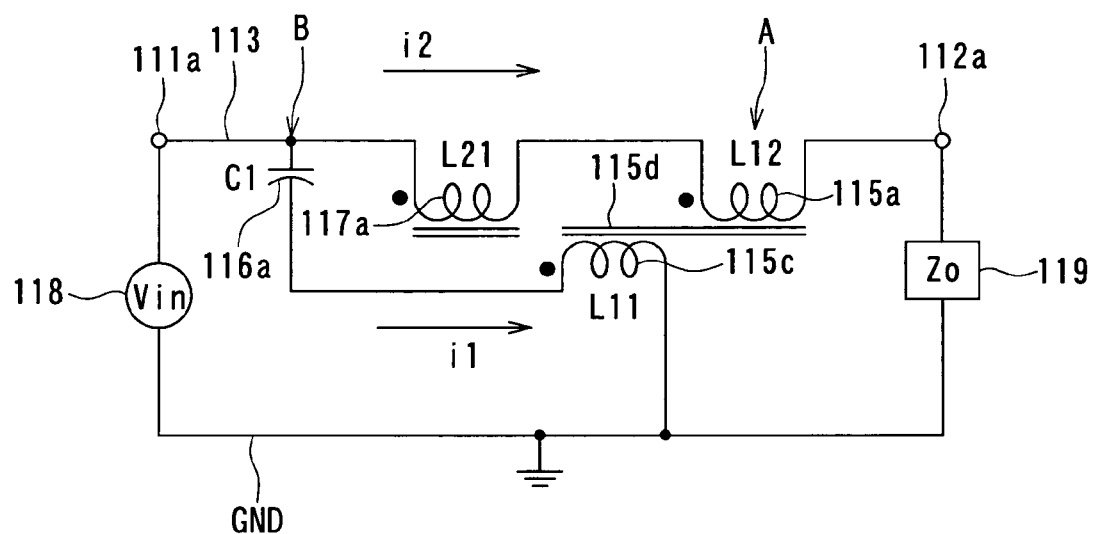
FIG. 4 is a schematic diagram for illustrating the operation of the cancellation-type noise suppressing circuit of FIG. 3.

Reference is now made to FIG. 4 to describe details of the operation of the cancellation-type noise suppressing circuit of FIG. 3. FIG. 4 illustrates only a portion of the noise suppressing circuit of FIG. 3 that relates to suppression of signals passing through the conductor line 113. The circuit of FIG. 4 incorporates the terminals 111a and 112a, the first winding 115a, the third winding 115c, the capacitor 116a, and the fourth winding 117a. A common mode noise source 118 and a load 119 are connected to the circuit of FIG. 4. The common mode noise source 118 is connected between the terminal 111a and the ground GND, and creates a potential difference Vin between the terminal 111a and the ground GND. The load 119 is connected between the terminal 112a and the ground GND, and has an impedance Zo.

In the circuit of FIG. 4, the inductance of the third winding 115c is L11, the inductance of the first winding 115a is L12, the capacitance of the capacitor 116a is C1, and the inductance of the fourth winding 117a is L21. The current passing through the capacitor 116a and the third winding 115c is 'i1', and the sum of impedances on the path of the current i1 is Z1. The current passing through the fourth winding 117a and the first winding 115a is 'i2', and the sum of impedances on the path of the current i2 is Z2.

The mutual inductance between the first winding 115a and the third winding 115c is M, and the coupling coefficient between the first winding 115a and the third winding 115c is K. The coupling coefficient K is expressed by the following equation (1).

$$K=M/\sqrt{(L11 \cdot L12)} \quad (1)$$

The above-mentioned sums Z1 and Z2 of impedances are expressed by the following equations (2) and (3), respectively, where 'j' indicates $\sqrt{(-1)}$, and '$\omega$' indicates the angular frequency of the common mode noise.

$$Z1=j(\omega L11-1/\omega C1) \quad (2)$$

$$Z2=Zo+j\omega(L12+L21) \quad (3)$$

The potential difference Vin is expressed by the following equations (4) and (5).

$$Vin=Z1 \cdot i1+j\omega M \cdot i2 \quad (4)$$

$$Vin=Z2 \cdot i2+j\omega M \cdot i1 \quad (5)$$

Based on the equations (2) to (5), an equation that expresses the current 'i2' without including the current 'i1' will be obtained below. First, the following equation (6) is obtained from the equation (4).

$$i1=(Vin-j\omega M \cdot i2)/Z1 \quad (6)$$

Next, the equation (6) is substituted into the equation (5), and the following equation (7) is thereby obtained.

$$i2=Vin(Z1-j\omega M)/(Z1 \cdot Z2+\omega^2 \cdot M^2) \quad (7)$$

To suppress common mode noise by the circuit of FIG. 4 means a reduction in current 'i2' expressed by the equation (7). According to the equation (7), the current 'i2' is reduced if the denominator of the right side of the equation (7) increases. Consideration will now be given to the denominator $(Z1 \cdot Z2+\omega^2 \cdot M^2)$ of the right side of the equation (7).

First, since Z1 is expressed by the equation (2), Z1 increases as the inductance L11 of the third winding 115c increases, and Z1 increases as the capacitance C1 of the capacitor 116a increases.

Next, since Z2 is expressed by the equation (3), Z2 increases as the sum of the inductance L12 of the first winding 115a and the inductance L21 of the fourth winding 117a increases. Therefore, the current 'i2' is reduced if at least one of the inductance L12 and the inductance L21 is increased. As the equation (7) indicates, it is noted that, although it is possible to suppress common mode noise by using the first winding 115a alone, it is possible to further suppress common mode noise by adding the fourth winding 117a.

Since the denominator of the right side of the equation (7) includes $\omega^2 \cdot M^2$, the current 'i2' is reduced by increasing the mutual inductance M. As shown in the equation (1), the coupling coefficient K is proportional to the mutual inductance M. Therefore, if the coupling coefficient K is increased, the effect of suppressing common mode noise by the circuit of FIG. 4 is enhanced. Since the mutual inductance M is included in a form of square in the denominator of the right side of the equation (7), the effect of suppressing common mode noise greatly varies, depending on the value of coupling coefficient K.

The foregoing description similarly applies to a portion of the cancellation-type noise suppressing circuit of FIG. 3 that relates to suppression of signals passing through the conductor line 114.

If the common mode noise source is located closer to the point A than the point B, the roles of the third winding 115c and the capacitor 116a are the reverse of the roles described with reference to FIG. 4. However, the foregoing description similarly applies to such a case, too.

According to the embodiment, common mode noise is suppressed through the use of the cancellation-type noise suppressing circuit of FIG. 3. Furthermore, in the embodiment, normal mode noise is suppressed through the use of capacitors described later and a leakage inductance resulting from the common mode choke coil made up of the windings 117a and 117b and the core 117c of FIG. 3.

Figure 5:
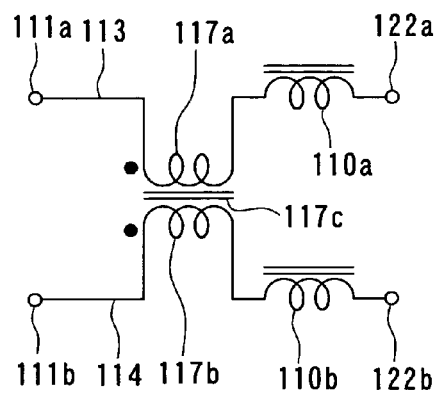
FIG. 5 is a schematic diagram illustrating an equivalent circuit of a common mode choke coil that the cancellation-type noise suppressing circuit of FIG. 3 includes.

The leakage inductance will now be described wherein the leakage inductance is produced by the common mode choke coil made up of the windings 117a and 117b and the core 117c of FIG. 3. In the common mode choke coil, the coupling coefficient between the windings 117a and 117b is smaller than 1. Consequently, the windings 117a and 117b produce leakage inductances along the conductor lines 113 and 114, respectively. Considering these leakage inductances, an equivalent circuit of the common mode choke coil is one shown in FIG. 5. In FIG. 5, numeral 122a indicates an imaginary terminal disposed between the windings 117a and 115a, and numeral 122b indicates an imaginary terminal disposed between the windings 117b and 115b. In the circuit of FIG. 5, an imaginary inductor 110a having an inductance equal to the leakage inductance along the conductor line 113 is inserted between the winding 117a and the terminal 122a. In addition, an imaginary inductor 110b having an inductance equal to the leakage inductance along the conductor line 114 is inserted between the winding 117b and the terminal 122b.

Figure 1:
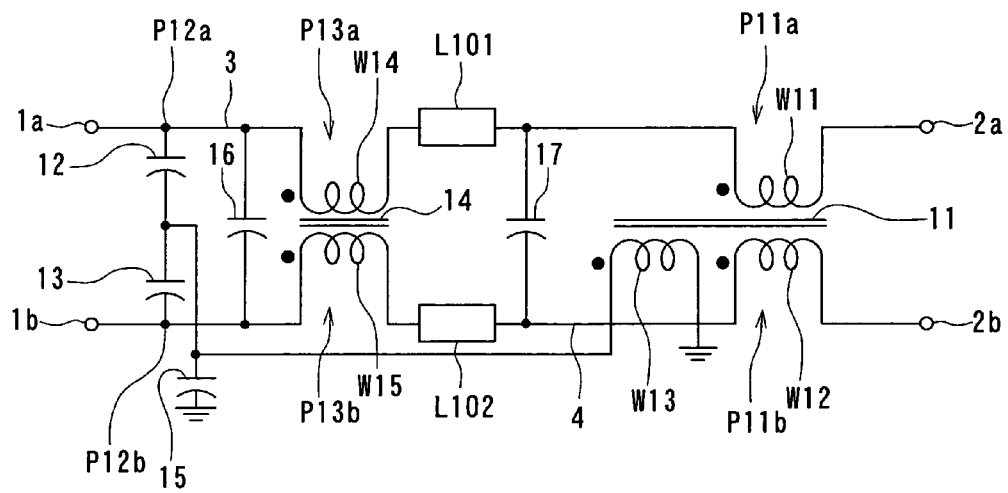
FIG. 1 is a schematic diagram illustrating the configuration of a noise suppressing circuit of a first embodiment of the invention.

Reference is now made to FIG. 1 to describe the noise suppressing circuit of the embodiment. FIG. 1 is a schematic diagram illustrating the configuration of the noise suppressing circuit of the embodiment. The noise suppressing circuit has the function of the cancellation-type noise suppressing circuit of FIG. 3.

The noise suppressing circuit of the embodiment comprises: a pair of terminals 1a and 1b; another pair of terminals 2a and 2b; a first conductor line 3 connecting the terminal 1a to the terminal 2a; and a second conductor line 4 connecting the terminal 1b to the terminal 2b.

The noise suppressing circuit further comprises: a first winding W11 inserted to the conductor line 3 at a specific first point P11a; a magnetic core 11; a second winding W12 that is inserted to the conductor line 4 at a point P11b corresponding to the first point P11a and coupled to the first winding W11 through the core 11, and that suppresses common mode noise in cooperation with the first winding W11; and a third winding W13 coupled to the first winding W11 and the second winding W12 through the core 11. The windings W11 and W12 and the core 11 make up a common mode choke coil. That is, the windings W11 and W12 are wound around the core 11 in such directions that, when magnetic fluxes are induced in the core 11 by currents flowing through the windings W11 and W12 when a normal mode current is fed to the windings W11 and W12, these fluxes are cancelled out by each other. The windings W11 and W12 thereby suppress common mode noise and allow normal mode noise to pass. The numbers of turns of the windings W11, W12 and W13 are equal, for example.

The noise suppressing circuit further comprises: a capacitor 12 for the common mode having an end connected to the conductor line 3 at a second point P12a different from the first point P11a and having the other end connected to one of ends of the third winding W13; and a capacitor 13 for the common mode having an end connected to the conductor line 4 at a point P12b corresponding to the second point P12a and having the other end connected to the other end of the capacitor 12 and the one of the ends of the third winding W13. The other of the ends of the third winding W13 is grounded. The capacitors 12 and 13 function as a high-pass filter for allowing common mode signals of frequencies equal to or greater than a specific value to pass. There are signal paths that respectively start from the points P12a and P12b, pass through the capacitors 12 and 13 and the third winding W13, and reach the ground. These signal paths transmit common mode injection signals that will be injected to the conductor lines 3 and 4 to suppress common mode noise.

The noise suppressing circuit further comprises: a fourth winding W14 inserted to the conductor line 3 at a third point P13a between the first point P11a and the second point P12a; a magnetic core 14; and a fifth winding W15 that is inserted to the conductor line 4 at a point P13b corresponding to the third point P13a and coupled to the fourth winding W14 through the core 14 so that a leakage inductance is produced, and that suppresses common mode noise in cooperation with the fourth winding W14. The windings W14 and W15 and the core 14 make up a common mode choke coil. That is, the windings W14 and W15 are wound around the core 14 in such directions that, when magnetic fluxes are induced in the core 14 by currents flowing through the windings W14 and W15 when a normal mode current is fed to the windings W14 and W15, these fluxes are cancelled out by each other. The windings W14 and W15 thereby suppress common mode noise and allow normal mode noise to pass. The numbers of turns of the windings W14 and W15 are equal, for example.

The noise suppressing circuit further comprises a capacitor 15 having an end connected to the node between the capacitors 12 and 13 and to the one of the ends of the third winding W13 and having the other end grounded.

The noise suppressing circuit further comprises a capacitor 16 for the normal mode having an end connected to the conductor line 3 at a point between the terminal 1a and the third point P13a and having the other end connected to the conductor line 4 at a point between the terminal 1b and the point P13b corresponding to the third point P13a. In the example shown in FIG. 1, in particular, one of the ends of the capacitor 16 is connected to the conductor line 3 at a point between the second point P12a and the third point P13a, and the other of the ends of the capacitor 16 is connected to the conductor line 4 at a point between the point P12b corresponding to the second point P12a and the point P13b corresponding to the third point P13a.

The noise suppressing circuit further comprises a capacitor 17 for the normal mode having an end connected to the conductor line 3 at a point between the third point P13a and the terminal 2a and having the other end connected to the conductor line 4 at a point between the terminal 2b and the point 13b corresponding to the third point P13a. In the example shown in FIG. 1, in particular, one of the ends of the capacitor 17 is connected to the conductor line 3 at a point between the third point P13a and the first point P11a, and the other of the ends of the capacitor 17 is connected to the conductor line 4 at a point between the point P13b corresponding to the third point P13a and the point P11b corresponding to the first point P11a.

In the embodiment, the coupling coefficient between the fourth winding W14 and the fifth winding W15 is smaller than 1. Therefore, the windings W14 and W15 produce leakage inductances along the conductor lines 3 and 4, respectively. FIG. 1 includes imaginary inductors L101 and L102 having inductances equal to these leakage inductances. The inductor L101 is inserted to the conductor line 3 at a point between the third point P13a and the node between the capacitor 17 and the conductor line 3. The inductor L102 is inserted to the conductor line 4 at a point between the point P13b corresponding to the third point P13a and the node between the capacitor 17 and the conductor line 4. The capacitors 16 and 17 reduce normal mode noise in cooperation with leakage inductances (the inductors L101 and L102) produced by the windings W14 and W15.

The windings W11, W12 and W13, the core 11, the windings W14 and W15, the core 14, and the capacitors 12, 13 and 15 correspond to the common mode noise suppressing means of the invention and exhibit the function of the cancellation-type noise suppressing circuit of FIG. 3.

The capacitors 16 and 17 and the inductors L101 and L102 make up a π filter and correspond to the normal mode noise suppressing means of the invention.

The function of the noise suppressing circuit of the embodiment will now be described. The common mode noise suppressing function of the noise suppressing circuit will be first described wherein a common mode noise source is located at a point closer to the points P12a and P12b than the points P11a and P11b except a point between the points P11a, P11b and the points P12a, P12b. In this case, the capacitors 12 and 13 detect a signal corresponding to common mode noise at the points P12a and P12b along the conductor lines 3 and 4, and further generate a common mode injection signal based on the signal detected, the injection signal having a phase opposite to that of the common mode noise. This injection signal is supplied to the third winding W13. The third winding W13 injects the injection signal to the conductor lines 3 and 4 through the first winding W11 and the second winding W12 such that the injection signal has a phase opposite to that of the common mode noise on the conductor lines 3 and 4. As a result, common mode noise is suppressed along portions of the conductor lines 3 and 4 from the points P11a and P11b onward along the direction of travel of the common mode noise.

Next, the common mode noise suppressing function of the noise suppressing circuit will be described, wherein a common mode noise source is located at a point closer to the points P11a and P11b than the points P12a and P12b except a point between the points P11a, P11b and the points P12a, P12b. In this case, a signal corresponding to common mode noise passing through the first winding W11 and the second winding W12 is induced at the third winding W13. In such a manner, the third winding W13 detects the signal corresponding to the common mode noise on the conductor lines 3 and 4 at the points P11a and P11b, and generates a common mode injection signal corresponding to the signal detected. The common mode injection signal passes through the capacitors 12 and 13 and gets injected to the conductor lines 3 and 4 at the points P12a and P12b. The common mode injection signal is injected to the conductor lines 3 and 4 such that the injection signal has a phase opposite to that of the common mode noise on the conductor lines 3 and 4. As a result, common mode noise is suppressed along portions of the conductor lines 3 and 4 from the points P12a and P12b onward along the direction of travel of the common mode noise.

The windings W14 and W15 and the core 14 as the peak value reducing section 107 reduce the peak value of common mode noise passing through the conductor lines 3 and 4 between the points P11a, P11b and the points P12a, P12b. The difference is thereby reduced between the peak value of the common mode noise propagating via the conductor lines 3 and 4 and the peak value of the injection signal injected to the conductor lines 3 and 4 via a path other than the conductor lines 3 and 4.

In the noise suppressing circuit of the embodiment, normal mode noise is suppressed by the capacitors 16 and 17 and the inductors L101 and L102 in either of the case in which the normal mode noise source is located at a point closer to the points P12a and P12b than the points P11a and P11b except a point between the points P11a, P11b and the points P12a, P12b and the case in which the normal mode noise source is located at a point closer to the points P11a and P11b than the points P12a and P12b except a point between the points P11a, P11b and the points P12a, P12b.

As thus described, the noise suppressing circuit of the embodiment is capable of reducing common mode noise and normal mode noise. In particular, the noise suppressing circuit of the embodiment has the function of a cancellation-type noise suppressing circuit for suppressing common mode noise. As a result, according to the noise suppressing circuit, it is possible to effectively suppress common mode noise in a wide range of frequencies, taking advantage of the cancellation-type noise suppressing circuit.

There is a possibility of simply combining a cancellation-type noise suppressing circuit and a typical filter circuit for suppressing normal mode noise to make up a circuit capable of suppressing common mode noise and normal mode noise. In this case, however, there arises a problem that the circuit includes a great number of components and the circuit is increased in dimensions.

In the embodiment, along the conductor lines 3 and 4, the windings W14 and W15 for suppressing common mode noise are provided at the points P13a, P13b between the points P11a, P11b and the points P12a, P12b, the windings W14 and W15 being coupled to produce leakage inductances. The filter for suppressing normal mode noise is made up of the inductors L101 and L102 and the capacitors 16 and 17 through the use of leakage inductances (the inductors L101 and L102) produced by the windings W14 and W15 for suppressing common mode noise. Therefore, in the embodiment, no inductance element is required for suppressing normal mode noise. As a result, according to the noise suppressing circuit of the embodiment, it is possible to reduce the circuit in dimensions by providing a smaller number of components, compared with the circuit made up of a simple combination of the cancellation-type noise suppressing circuit and the filter circuit for suppressing normal mode noise.

In the embodiment, it is acceptable that the coupling coefficient between the windings W14 and W15 falls within a range of 0.01 to 0.9999 inclusive. It is preferred to appropriately determine this coupling coefficient in accordance with the proportion of common mode noise and normal mode noise in an environment in which the noise suppressing circuit is used. The coupling coefficient preferably falls within a range of 0.2 to 0.9995 inclusive in an environment in which some normal mode noise and some common mode noise both exist. The coupling coefficient preferably falls within a range of 0.4 to 0.9990 inclusive in an environment in which there exist normal mode noise and common mode noise of similar levels.

In the embodiment, the transmission path of common mode injection signals includes the capacitors 12 and 13 as elements for allowing the injection signals to pass. Therefore, according to the embodiment, it is possible only by the capacitors 12 and 13 to detect a signal corresponding to common mode noise and to generate an injection signal having a phase opposite to that of the common mode noise. As a result, it is possible to further reduce the number of components.

The noise suppressing circuit of the embodiment comprises the capacitor 15 having the end connected to one of the ends of the third winding W13 and to the node between the capacitors 12 and 13, and having the other end grounded. As a result, it is possible to improve the common mode noise suppressing function of the noise suppressing circuit in a high frequency region.

Figure 6:
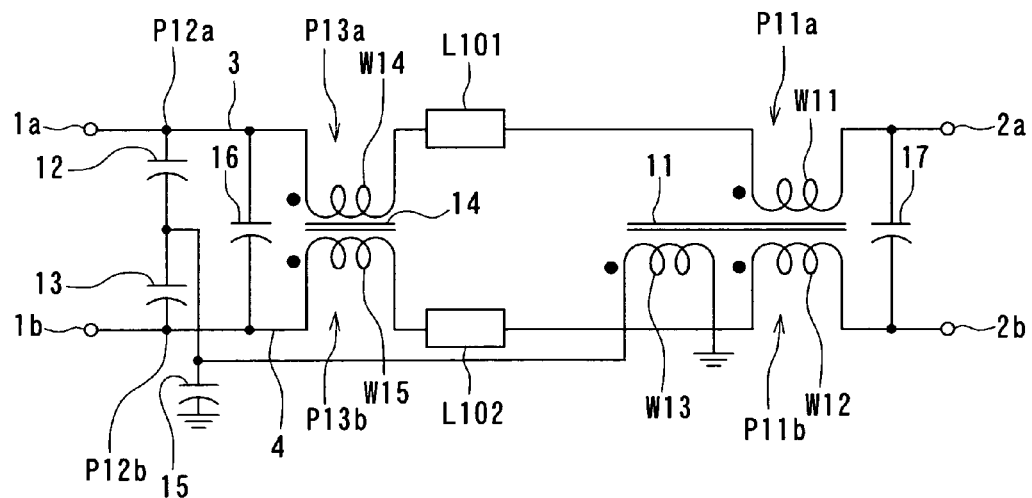
FIG. 6 is a schematic diagram for illustrating modification examples of the noise suppressing circuit of the first embodiment of the invention.

Reference is now made to FIG. 6 to describe three modification examples of the noise suppressing circuit of the embodiment.

FIG. 6 is a schematic diagram illustrating the first modification example of the noise suppressing circuit of the embodiment. The circuit of the first modification example has a configuration in which the capacitor 17 is connected to the conductor lines 3 and 4 at points different from the points at which the capacitor 17 is connected to the conductor lines 3 and 4 in the noise suppressing circuit of FIG. 1. That is, in the first modification example, the capacitor 17 has an end connected to the conductor line 3 at a point between the first point P11a and the terminal 2a, and has the other end connected to the conductor line 4 at a point between the terminal 2b and the point P11b corresponding to the first point P11a. The capacitors 16 and 17 and the inductors L101 and L102 reduce normal mode noise passing through the conductor lines 3 and 4 in this configuration, too.

The circuit of the second modification example has a configuration in which the capacitor 17 is excluded from the noise suppressing circuit of FIG. 6. In this configuration, the capacitor 16 and the inductors L101 and L102 reduce normal mode noise passing through the conductor lines 3 and 4.

The circuit of the third modification example has a configuration in which the capacitor 16 is excluded from the noise suppressing circuit of FIG. 6. In this configuration, the capacitor 17 and the inductors L101 and L102 reduce normal mode noise passing through the conductor lines 3 and 4.

The remainder of configurations, functions and effects of the first to third modification examples are the same as those of the noise suppressing circuit of FIG. 1.

In addition to the foregoing three modification examples, various modifications of the noise suppressing circuit of the embodiment are possible. For example, it is acceptable as long as the capacitors 16 and 17 for the normal mode have ends connected to the conductor line 3 at points that sandwich the fourth winding W14, and have the other ends connected to the conductor line 4 at points that sandwich the fifth winding W15.

Reference is now made to FIG. 7 to FIG. 14 to describe six examples of configuration of the common mode choke coil including the core 14 and the windings W14 and W15 of the embodiment.

Figure 7:
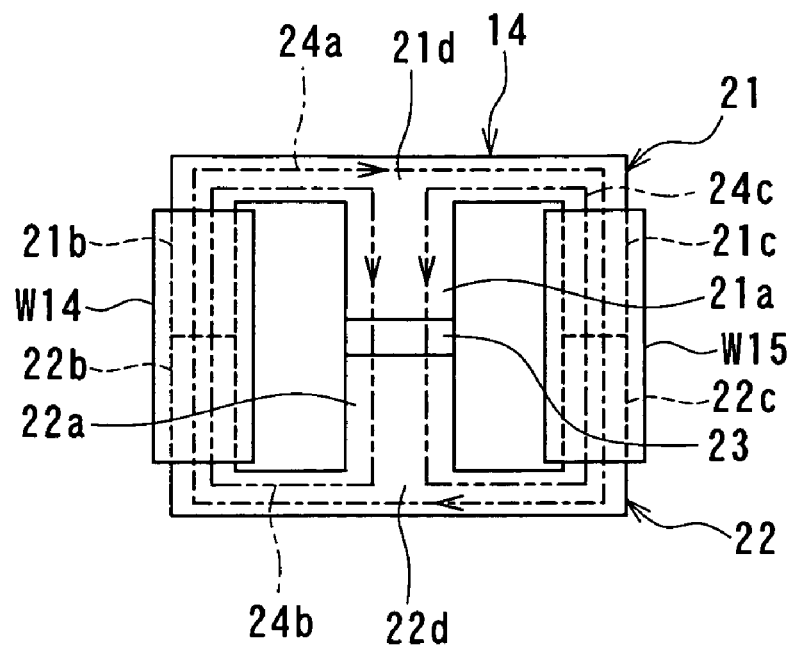
FIG. 7 is a front view illustrating a first example of the common mode choke coil of the noise suppressing circuit of the first embodiment of the invention.

First, reference is made to FIG. 7 to describe the first example of the common mode choke coil. FIG. 7 is a front view of the first example of the common mode choke coil. In the first example, the core 14 incorporates: two E-shaped magnetic members 21 and 22 each of which is made of a magnetic material; and a magnetic member 23 made of a magnetic material. The magnetic member 21 has: a middle leg 21a; legs 21b and 21c disposed on both sides of the leg 21a with specific spaces from the leg 21a; and a coupling portion 21d coupling ends of the legs 21a, 21b and 21c to one another. Similarly, the magnetic member 22 has: a middle leg 22a; legs 22b and 22c disposed on both sides of the leg 22a with specific spaces from the leg 22a; and a coupling portion 22d coupling ends of the legs 22a, 22b and 22c to one another. The magnetic members 21 and 22 are disposed such that the other ends of the legs 21a and 22a are opposed to each other, the other ends of the legs 21b and 22b are opposed to each other, and the other ends of the legs 21c and 22c are opposed to each other. The other ends of the legs 21b and 22b are joined to each other, and the other ends of the legs 21c and 22c are joined to each other, too. The other ends of the legs 21a and 22a are opposed to each other with a specific space from each other, and the magnetic member 23 is inserted between the other ends of the legs 21a and 22a. The magnetic member 23 is joined to the other ends of the legs 21a and 22a. The magnetic members 21 and 22 are made of a high-permeability magnetic material, for example. The magnetic member 23 is made of a magnetic material having high saturation flux density, for example. The magnetic members 21 and 22 are made of ferrite, for example. The magnetic member 23 may be made of an amorphous magnetic material or may be a dust core.

The winding W14 is wound around the legs 21b and 22b. The winding W15 is wound around the legs 21c and 22c. The core 14 of the first example forms a magnetic path 24a for allowing a magnetic flux for coupling the windings W14 and W15 to each other to pass, a magnetic path 24b for allowing a leakage flux produced by the winding W14 to pass, and a magnetic path 24c for allowing a leakage flux produced by the winding W15 to pass. The magnetic path 24a is made up of the legs 21b, 22b, 21c and 22c, and the coupling portions 21d and 22d. The magnetic path 24b is made up of the legs 21a, 22a, 21b and 22b, a portion of the coupling portion 21d, a portion of the coupling portion 22d, and the magnetic member 23. The magnetic path 24c is made up of the legs 21a, 22a, 21c and 22c, another portion of the coupling portion 21d, another portion of the coupling portion 22d, and the magnetic member 23. The legs 21a and 22a and the magnetic member 23 correspond to the second magnetic path forming portion of the invention. The legs 21b, 22b, 21c and 22c, and the coupling portions 21d and 22d serve as both of the first magnetic path forming portion and the second magnetic path forming portion of the invention.

The operation of the common mode choke coil of the first example will now be described. In the common mode choke coil, when common mode currents flow through the windings W14 and W15, magnetic fluxes generated by the currents flowing through the windings W14 and W15 pass through the magnetic path 24a in such directions as to be laid over each other. As a result, inductances are produced at the windings W14 and W15.

On the other hand, when normal mode currents flow through the windings W14 and W15, magnetic fluxes generated by the currents flowing through the windings W14 and W15 pass through the magnetic path 24a in such directions as to cancel out each other. As a result, no inductance is produced at the windings W14 and W15. When a normal mode current flows through the winding W14, part of a magnetic flux generated by the winding W14 passes through the magnetic path 24a as a leakage flux. This leakage flux produces a leakage inductance for the normal mode current. Similarly, when a normal mode current flows through the winding W15, part of a magnetic flux generated by the winding W15 passes through the magnetic path 24c as a leakage flux. This leakage flux produces a leakage inductance for the normal mode current.

Figure 8:
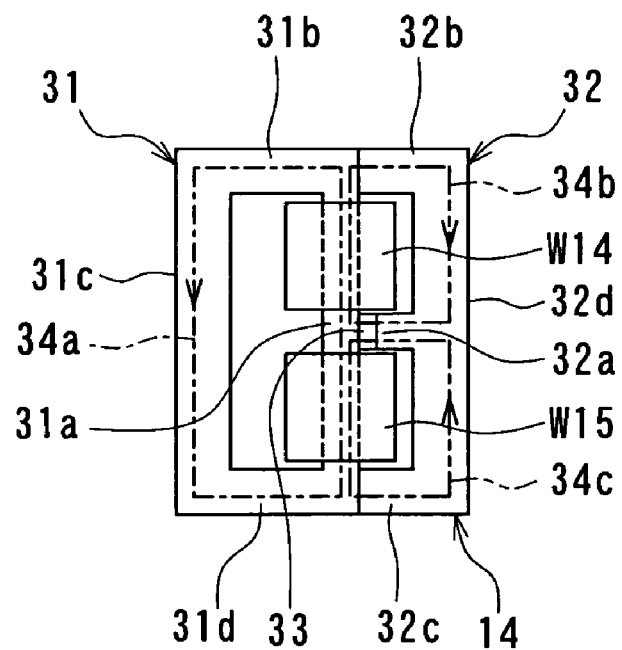
FIG. 8 is a front view illustrating a second example of the common mode choke coil of the noise suppressing circuit of the first embodiment of the invention.

Reference is now made to FIG. 8 to describe the second example of the common mode choke coil. FIG. 8 is a front view of the second example of the common mode choke coil. In the second example, the core 14 incorporates: a rectangular-ring-shaped magnetic member 31 made of a magnetic material; an E-shaped magnetic member 32 made of a magnetic material; and a magnetic member 33. The magnetic member 31 has: two straight-line-shaped portions 31a and 31c disposed parallel to each other; and another two straight-line-shaped portions 31b and 31d disposed parallel to each other. The magnetic member 32 has: a middle leg 32a; legs 32b and 32c disposed on both sides of the leg 32a with specific spaces from the leg 32a; and a coupling portion 32d coupling ends of the legs 32a, 32b and 32c to one another. The other ends of the legs 32b and 32c are joined to the straight-line-shaped portion 31a of the magnetic member 31. The other end of the leg 32a is opposed to the straight-line-shaped portion 31a with a specific space. The magnetic member 33 is inserted between the other end of the leg 32a and the straight-line-shaped portion 31a. The magnetic member 33 is joined to the leg 32a and the straight-line-shaped portion 31a. The magnetic members 31 and 32 are made of a high-permeability magnetic material, for example. The magnetic member 33 is made of a magnetic material having high saturation flux density, for example. The magnetic members 31 and 32 are made of ferrite, for example. The magnetic member 33 may be made of an amorphous magnetic material or may be a dust core.

The winding W14 is wound around the straight-line-shaped portion 31a at a point between the legs 32a and 32b. The winding W15 is wound around the straight-line-shaped portion 31a at a point between the legs 32a and 32c. The core 14 of the second example forms a magnetic path 34a for allowing a magnetic flux for coupling the windings W14 and W15 to each other to pass, a magnetic path 34b for allowing a leakage flux produced by the winding W14 to pass, and a magnetic path 34c for allowing a leakage flux produced by the winding W15 to pass. The magnetic path 34a is made up of the magnetic member 31. The magnetic path 34b is made up of the legs 32a and 32b, a portion of the coupling portion 32d, a portion of the straight-line-shaped portion 31a, and the magnetic member 33. The magnetic path 34c is made up of the legs 32a and 32c, another portion of the coupling portion 32d, another portion of the straight-line-shaped portion 31a, and the magnetic member 33. The magnetic member 31 corresponds to the first magnetic path forming portion of the invention. The straight-line-shaped portion 31a of the magnetic member 31, the magnetic member 32 and the magnetic member 33 correspond to the second magnetic path forming portion of the invention.

The operation of the common mode choke coil of the second example is similar to that of the common mode choke coil of the first example.

Figure 9:
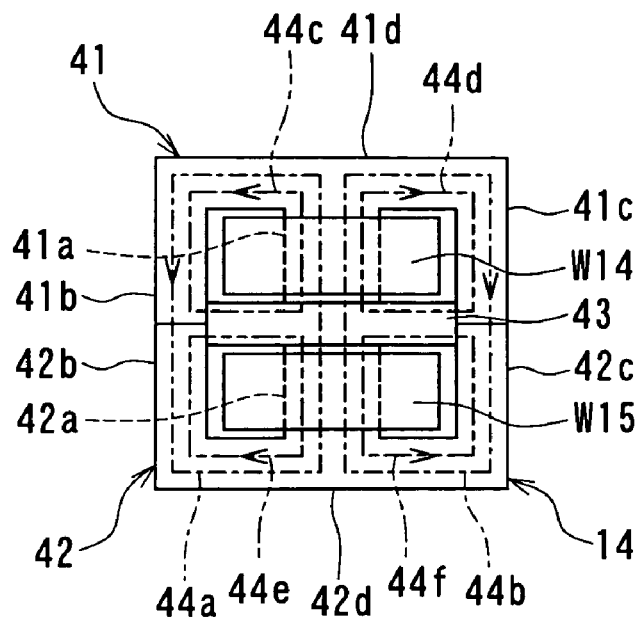
FIG. 9 is a front view illustrating a third example of the common mode choke coil of the noise suppressing circuit of the first embodiment of the invention.

Reference is now made to FIG. 9 to describe the third example of the common mode choke coil. FIG. 9 is a front view of the third example of the common mode choke coil. In the third example, the core 14 incorporates: two E-shaped magnetic members 41 and 42 each of which is made of a magnetic material; and a flat-plate-shaped magnetic member 43 made of a magnetic material. The magnetic member 41 has: a middle leg 41a; legs 41b and 41c disposed on both sides of the leg 41a with specific spaces from the leg 41a; and a coupling portion 41d coupling ends of the legs 41a, 41b and 41c to one another. Similarly, the magnetic member 42 has: a middle leg 42a; legs 42b and 42c disposed on both sides of the leg 42a with specific spaces from the leg 42a; and a coupling portion 42d coupling ends of the legs 42a, 42b and 42c to one another. The magnetic members 41 and 42 are disposed such that the other ends of the legs 41a and 42a are opposed to each other, the other ends of the legs 41b and 42b are opposed to each other, and the other ends of the legs 41c and 42c are opposed to each other. The other ends of the legs 41b and 42b are joined to each other, and the other ends of the legs 41c and 42c are joined to each other, too. The legs 41a and 42a are shorter than the other legs 41b, 41c, 42b and 42c. The other ends of the legs 41a and 42a are opposed to each other with a specific space from each other, and the magnetic member 43 is inserted between the other ends of the legs 41a and 42a. The magnetic member 43 is joined to the other ends of the legs 41a, 41b, 41c, 42a, 42b and 42c. The magnetic members 41 and 42 are made of a high-permeability magnetic material, for example. The magnetic member 43 is made of a magnetic material having high saturation flux density, for example. The magnetic members 41 and 42 are made of ferrite, for example. The magnetic member 43 may be made of an amorphous magnetic material or may be a dust core.

The winding W14 is wound around the leg 41a. The winding W15 is wound around the leg 42a. The core 14 of the third example forms magnetic paths 44a and 44b for allowing a magnetic flux for coupling the windings W14 and W15 to each other to pass, magnetic paths 44c and 44d for allowing a leakage flux produced by the winding W14 to pass, and magnetic paths 44e and 44f for allowing a leakage flux produced by the winding W15 to pass. The magnetic path 44a is made up of the legs 41a, 42a, 41b and 42b, and a portion of the coupling portion 41d, and a portion of the coupling portion 42d. The magnetic path 44b is made up of the legs 41a, 42a, 41c and 42c, another portion of the coupling portion 41d, and another portion of the coupling portion 42d. The magnetic path 44c is made up of the legs 41a and 41b, the portion of the coupling portion 41d, and a portion of the magnetic member 43. The magnetic path 44d is made up of the legs 41a and 41c, the other portion of the coupling portion 41d, and another portion of the magnetic member 43. The magnetic path 44e is made up of the legs 42a and 42b, the portion of the coupling portion 42d, and the portion of the magnetic member 43. The magnetic path 44f is made up of the legs 42a and 42c, the other portion of the coupling portion 42d, and the other portion of the magnetic member 43. The magnetic member 43 corresponds to the second magnetic path forming portion of the invention. The magnetic members 41 and 42 serve as both of the first magnetic path forming portion and the second magnetic path forming portion of the invention.

The operation of the common mode choke coil of the third example is similar to that of the common mode choke coil of the first example.

Figure 10:
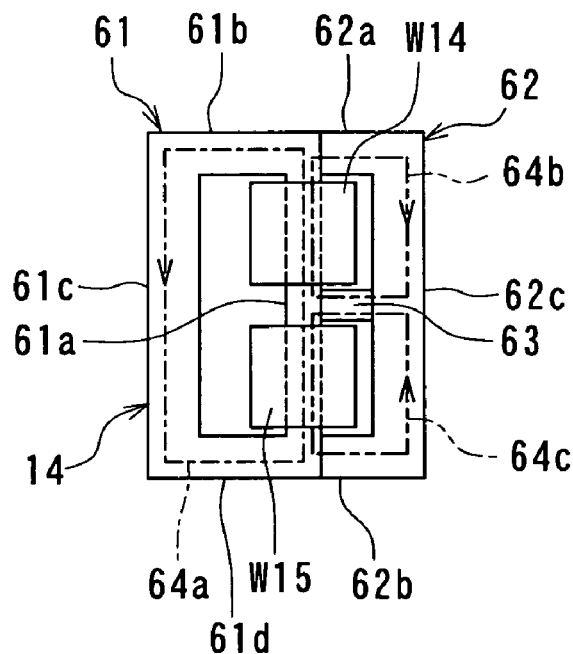
FIG. 10 is a front view illustrating a fourth example of the common mode choke coil of the noise suppressing circuit of the first embodiment of the invention.

Reference is now made to FIG. 10 to describe the fourth example of the common mode choke coil. FIG. 10 is a front view of the fourth example of the common mode choke coil. In the fourth example, the core 14 incorporates magnetic members 61, 62 and 63 each of which is made of a magnetic material. The magnetic member 61 is rectangular-ring-shaped, and has two straight-line-shaped portions 61a and 61c disposed parallel to each other, and another two straight-line-shaped portions 61b and 61d disposed parallel to each other. The magnetic member 62 has: two legs 62a and 62b disposed with a specific space from each other; and a coupling portion 62c coupling ends of the legs 62a and 62b to each other. The other ends of the legs 62a and 62b are joined to the straight-line-shaped portion 61a of the magnetic member 61. The magnetic member 63 is inserted between a middle portion of the coupling portion 62c and a middle portion of the straight-line-shaped portion 61a. The magnetic member 63 is joined to the coupling portion 62c and to the straight-line-shaped portion 61a. The magnetic members 61 and 62 are made of a high-permeability magnetic material, for example. The magnetic member 63 is made of a magnetic material having high saturation flux density, for example. The magnetic members 61 and 62 are made of ferrite, for example. The magnetic member 63 may be made of an amorphous magnetic material or may be a dust core.

The winding W14 is wound around a portion of the straight-line-shaped portion 61a closer to the straight-line-shaped portion 61b than a mid point of the portion 61a. The winding W15 is wound around a portion of the straight-line-shaped portion 61a closer to the straight-line-shaped portion 61d than the mid point of the portion 61a. The core 14 of the fourth example forms a magnetic path 64a for allowing a magnetic flux for coupling the windings W14 and W15 to each other to pass, a magnetic path 64b for allowing a leakage flux produced by the winding W14 to pass, and a magnetic path 64c for allowing a leakage flux produced by the winding W15 to pass. The magnetic path 64a is made up of the magnetic member 61. The magnetic path 64b is made up of the leg 62a, a portion of the coupling portion 62c, a portion of the straight-line-shaped portion 61a, and the magnetic member 63. The magnetic path 64c is made up of the leg 62b, another portion of the coupling portion 62c, another portion of the straight-line-shaped portion 61a, and the magnetic member 63. The magnetic member 61 corresponds to the first magnetic path forming portion of the invention. The straight-line-shaped portion 61a of the magnetic member 61, and the magnetic members 62 and 63 correspond to the second magnetic path forming portion of the invention.

The operation of the common mode choke coil of the fourth example is similar to that of the common mode choke coil of the first example.

Figure 11:
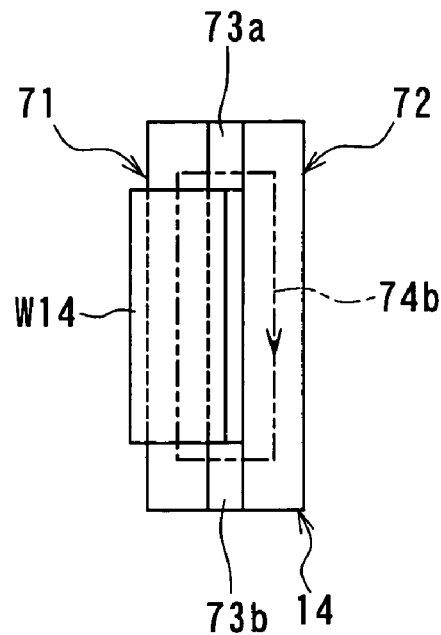
FIG. 11 is a side view illustrating a fifth example of the common mode choke coil of the noise suppressing circuit of the first embodiment of the invention.
Figure 12:
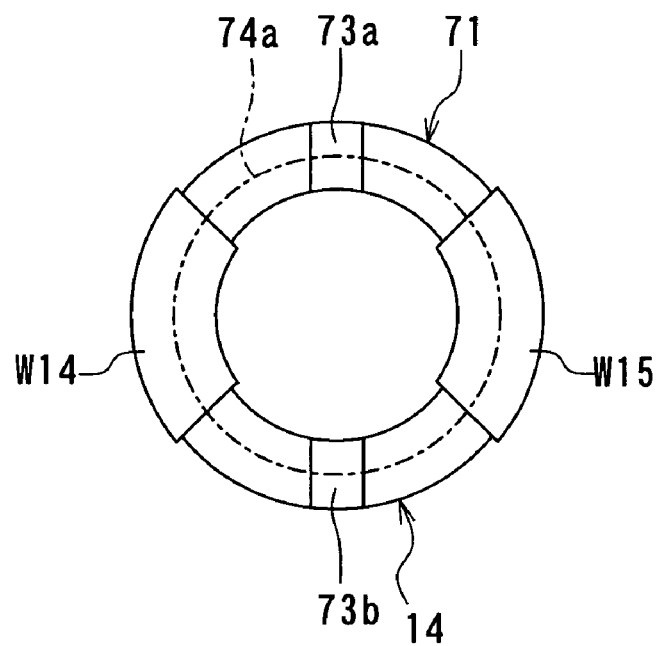
FIG. 12 is a front view illustrating part of the common mode choke coil of FIG. 11.

Reference is now made to FIG. 11 and FIG. 12 to describe the fifth example of the common mode choke coil. FIG. 11 is a side view of the fifth example of the common mode choke coil. FIG. 12 is a front view of a portion of the common mode choke coil of FIG. 11. In the fifth example, the core 14 incorporates: two circular-ring-shaped magnetic members 71 and 72 each of which is made of a magnetic material; and magnetic members 73a and 73b joining the magnetic members 71 and 72 to each other. The magnetic members 71 and 72 are disposed such that the center axes thereof coincide with each other, and joined to each other through the magnetic members 73a and 73b. The magnetic members 73a and 73b are disposed at positions symmetric with respect to the center axis of the magnetic members 71 and 72. The magnetic members 71 and 72 are made of a high-permeability magnetic material, for example. The magnetic members 73a and 73b are made of a magnetic material having high saturation flux density, for example. The magnetic members 71 and 72 are made of ferrite, for example. The magnetic members 73a and 73b may be made of an amorphous magnetic material or may be dust cores.

The windings W14 and W15 are wound around the magnetic member 71. The windings W14 and W15 are disposed at two positions in the magnetic member 71 that are symmetric with respect to the center axis of the magnetic member 71 and that are located between the two positions at which the magnetic members 73a and 73b are located. FIG. 12 illustrates the magnetic members 71, 73a and 73b and the windings W14 and W15.

The core 14 of the fifth example forms a magnetic path 74a for allowing a magnetic flux for coupling the windings W14 and W15 to each other to pass, a magnetic path 74b for allowing a leakage flux produced by the winding W14 to pass, and a magnetic path (not shown) for allowing a leakage flux produced by the winding W15 to pass. The magnetic path 74a is made up of the magnetic member 71. The magnetic path 74b is made up of a left half of the magnetic member 71 of FIG. 12, the magnetic members 73a and 73b, and the magnetic member 72. The magnetic path that allows a leakage flux produced by the winding W15 to pass is made up of a right half of the magnetic member 71 of FIG. 12, the magnetic members 73a and 73b, and the magnetic member 72. The magnetic members 72, 73a and 73b correspond to the second magnetic path forming portion of the invention. The magnetic member 71 serves as both of the first magnetic path forming portion and the second magnetic path forming portion of the invention.

The operation of the common mode choke coil of the fifth example is similar to that of the common mode choke coil of the first example.

Figure 13:
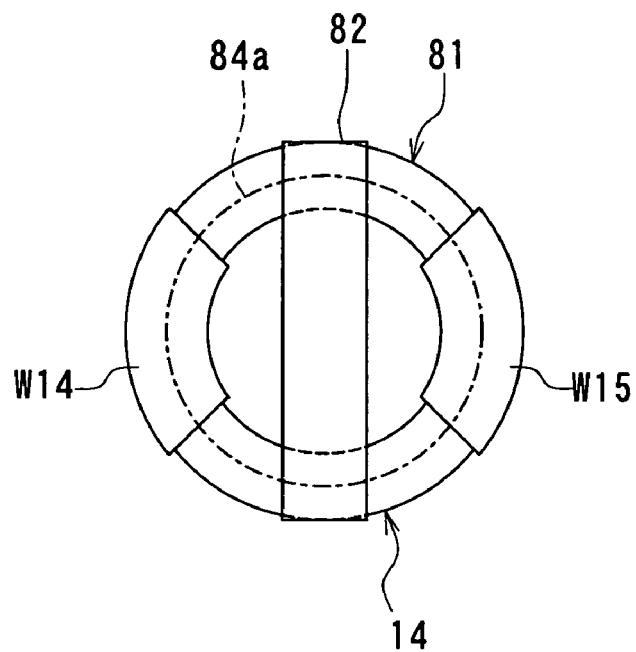
FIG. 13 is a front view illustrating a sixth example of the common mode choke coil of the noise suppressing circuit of the first embodiment of the invention.
Figure 14:
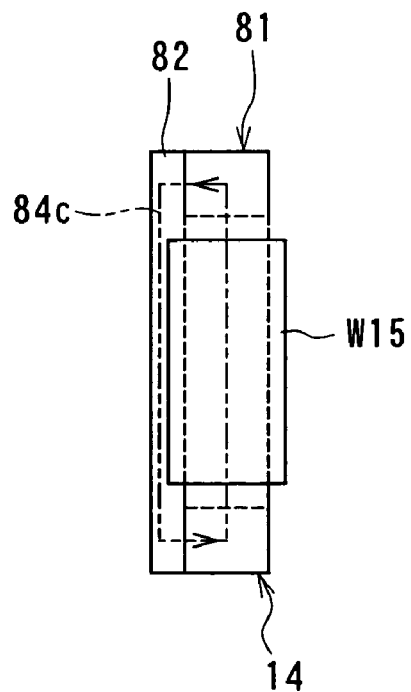
FIG. 14 is a side view of the common mode choke coil of FIG. 13.

Reference is now made to FIG. 13 and FIG. 14 to describe the sixth example of the common mode choke coil. FIG. 13 is a front view of the sixth example of the common mode choke coil. FIG. 14 is a side view of the common mode choke coil of FIG. 13. In the sixth example, the core 14 incorporates: a single circular-ring-shaped magnetic member 81 made of a magnetic material; and a flat-plate-shaped magnetic member 82 made of a magnetic material. Portions of the magnetic member 82 near ends thereof are joined to the magnetic member 81 at positions symmetric with respect to the center axis of the magnetic member 81. The magnetic member 81 is made of a high-permeability magnetic material, for example. The magnetic member 82 is made of a magnetic material having high saturation flux density, for example. The magnetic member 81 is made of ferrite, for example. The magnetic member 82 may be made of an amorphous magnetic material or may be a dust core.

The windings W14 and W15 are wound around the magnetic member 81. The windings W14 and W15 are disposed at two positions in the magnetic member 81 that are symmetric with respect to the center axis of the magnetic member 81 and that are located between the two positions at which the magnetic member 82 is joined to the magnetic member 81.

The core 14 of the sixth example forms a magnetic path 84a for allowing a magnetic flux for coupling the windings W14 and W15 to each other to pass, a magnetic path (not shown) for allowing a leakage flux produced by the winding W14 to pass, and a magnetic path 84c for allowing a leakage flux produced by the winding W15 to pass. The magnetic path 84a is made up of the magnetic member 81. The magnetic path that allows a leakage flux produced by the winding W14 to pass is made up of a left half of the magnetic member 81 of FIG. 13 and the magnetic member 82. The magnetic path 84c is made up of a right half of the magnetic member 81 of FIG. 13 and the magnetic member 82. The magnetic member 82 corresponds to the second magnetic path forming portion of the invention. The magnetic member 81 serves as both the first magnetic path forming portion and the second magnetic path forming portion of the invention.

The operation of the common mode choke coil of the sixth example is similar to that of the common mode choke coil of the first example.

An example of transmission characteristic of the noise suppressing circuit of the embodiment will now be described. Here, transmission characteristics were obtained by simulation for the noise suppressing circuit of FIG. 1 and the noise suppressing circuit of the first to third modification examples described with reference to FIG. 6. Frequency characteristics of gains were obtained as the transmission characteristics.

Values that will now be given were used for the simulation. The inductance of each of the windings W11, W12 and W13 and the windings W14 and W15 of FIG. 1 and FIG. 6 was 2 mH. The coupling coefficient of the windings W14 and W15 was 0.955. The inductance of each of the inductors L101 and L102 was 90 µH. The capacitance of each of the capacitors 12 and 13 was 2200 pF. The capacitance of the capacitor 15 was 1000 pF. The capacitance of each of the capacitors 16 and 17 was 0.47 µF. The coupling coefficient of the windings W11 and W12 was 0.995. In this case, the leakage inductance produced by each of the windings W11 and W12 was 10 µH.

Figure 15:
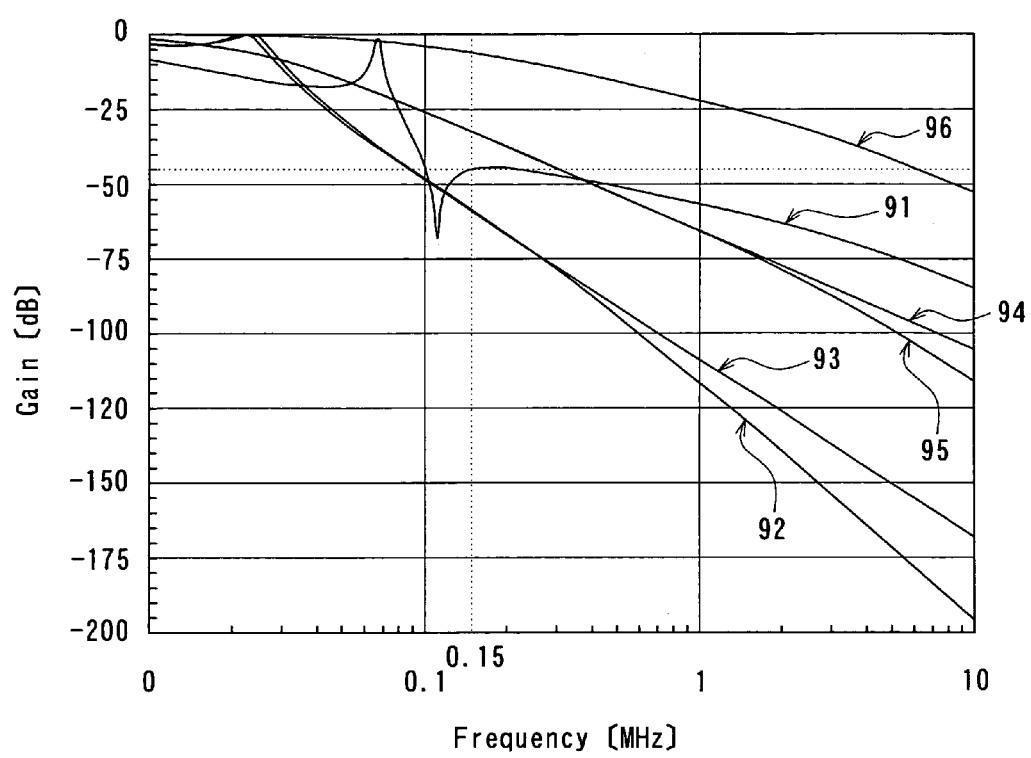
FIG. 15 is a plot showing an example of transmission characteristic of the noise suppressing circuit of the first embodiment of the invention.

FIG. 15 shows the transmission characteristics obtained by the above-mentioned simulation. A line with numeral 91 indicates the transmission characteristic of the noise suppressing circuit of FIG. 1 for common mode signals and the transmission characteristic of the noise suppressing circuit of the first modification example of FIG. 6 for common mode signals. The two transmission characteristics indicated with the line with numeral 91 completely coincide with each other. As shown in FIG. 15, it is noted that the noise suppressing circuit of FIG. 1 and the noise suppressing circuit of FIG. 6 have an excellent common mode noise suppressing effect in a wide frequency range.

In FIG. 15, a line with numeral 92 indicates the transmission characteristic of the noise suppressing circuit of FIG. 1 for normal mode signals while a line with numeral 93 indicates the transmission characteristic of the noise suppressing circuit of FIG. 6 for normal mode signals. The two transmission characteristics indicated with the lines with numerals 92 and 93 are closely analogous to each other. As shown in FIG. 15, it is noted that the noise suppressing circuit of FIG. 1 and the noise suppressing circuit of FIG. 6 have an excellent normal mode noise suppressing effect in a wide frequency range.

In FIG. 15, a line with numeral 94 indicates the transmission characteristic of the noise suppressing circuit of the second modification example for normal mode signals while a line with numeral 95 indicates the transmission characteristic of the noise suppressing circuit of the third modification example for normal mode signals. The two transmission characteristics indicated with the lines with numerals 94 and 95 are closely analogous to each other. A line with numeral 96 indicates the transmission characteristic for normal mode signals of a circuit having a configuration in which the capacitors 16 and 17 are excluded from the noise suppressing circuit of FIG. 6. Comparing the three transmission characteristics indicated with the lines 94 to 96, it is noted that the noise suppressing circuit of the second or third modification example has a normal mode noise suppressing effect in a wider frequency range, compared with the circuit having the configuration in which the capacitors 16 and 17 are excluded from the noise suppressing circuit of FIG. 6. Comparing the two transmission characteristics indicated with the lines 92 and 93 with the two transmission characteristics indicated with the lines 94 and 95, it is noted that the noise suppressing circuit of the embodiment has a greater normal mode noise suppressing effect when the circuit comprises both of the capacitors 16 and 17, compared with the case in which the circuit comprises one of the capacitors 16 and 17.

In many countries, various restrictions are placed on conducted noise, that is, noise emerging from an electronic apparatus and emitted outside through an alternate current power line. According to the restrictions on conducted noise imposed in a great part of such countries, the frequency range to be restricted ranges from 150 kHz to 30 MHz. Normal mode noise is problematic in a low frequency range of 1 MHz and lower, in particular. According to the noise suppressing circuit of FIG. 1 and the noise suppressing circuit of FIG. 6, as shown in FIG. 15, it is possible that the gains of normal mode signals are made equal to −45 dB or lower in a frequency range of 150 kHz to 1 MHz. As a result, the noise suppressing circuits are adaptable to various restrictions.

The noise suppressing circuit of the foregoing embodiment is capable of being used as a means for reducing ripple voltage and noise emerging from a power transforming circuit or as a means for reducing noise on a power line in power-line communications and for preventing communications signals on an indoor power line from leaking to an outdoor power line.

In the embodiment, a pair of the fourth winding W14 and the fifth winding W15 are coupled to each other so as to produce a leakage inductance, and the normal mode noise suppressing means is formed by using this leakage inductance and the capacitors. However, it is possible that a pair of the first winding W11 and the second winding W12 are coupled to each other so as to produce a leakage inductance, and the normal mode noise suppressing means is formed by using this leakage inductance and the capacitors. It is also possible that the pair of the first winding W11 and the second winding W12 and the pair of the fourth winding W14 and the fifth winding W15 are both coupled to each other so as to produce a leakage inductance, and the normal mode noise suppressing means is formed by using this leakage inductance and the capacitors. In either of these cases, similar effects are obtained. In either of the cases, the core around which the two windings producing a leakage inductance are wound may have a shape as shown in FIG. 7 to FIG. 14, for example. If the first winding W11 and the second winding W12 are coupled to each other so as to produce a leakage inductance through the use of the core of FIG. 7 to FIG. 14, the third winding W13 may be wound around the first magnetic path forming portion that forms the magnetic path allowing a magnetic flux for coupling the windings W11 and W12 to each other to pass.

Second Embodiment

Figure 16:
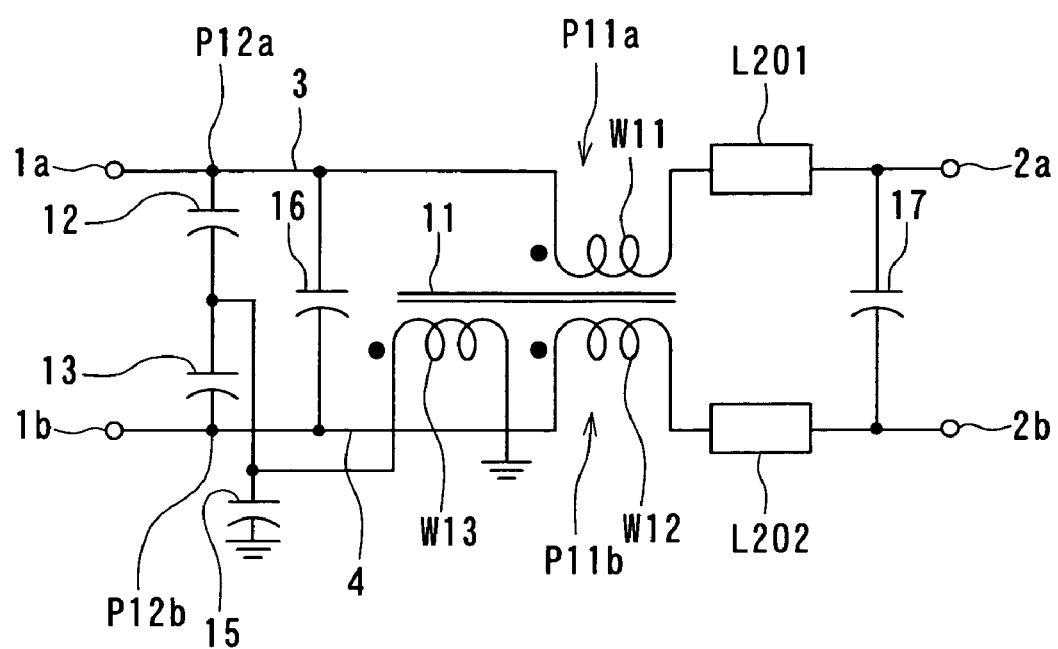
FIG. 16 is a schematic diagram illustrating a configuration of a noise suppressing circuit of a second embodiment of the invention.

FIG. 16 is a schematic diagram illustrating the configuration of a noise suppressing circuit of a second embodiment of the invention. The noise suppressing circuit of the second embodiment does not include any peak value reducing section. To be specific, the noise suppressing circuit of the second embodiment has a configuration of the noise suppressing circuit of FIG. 6 from which the fourth winding W14, the fifth winding W15 and the core 14 are excluded and in which the first winding W11 and the second winding W12 are coupled to each other to produce a leakage inductance. The magnetic core around which the windings W11 and W12 are wound may have a shape as shown in FIG. 7 to FIG. 14, for example. In this case, the third winding W13 may be wound around the first magnetic path forming portion that forms the magnetic path allowing a magnetic flux for coupling the windings W11 and W12 to each other to pass.

The windings W11 and W12 produce a leakage inductance on each of the conductor lines 3 and 4. FIG. 16 includes imaginary inductors L201 and L202 having inductances equal to these leakage inductances. The inductor L201 is inserted to the conductor line 3 at a point between the first point P11a and the terminal 2a. The inductor L202 is inserted to the conductor line 4 at a point between the terminal 2b and the point P11b corresponding to the first point P11a. The capacitor 17 has an end connected to the conductor line 3 at a point between the inductor L201 and the terminal 2a, and has the other end connected to the conductor line 4 at a point between the inductor L202 and the terminal 2b.

The noise suppressing circuit of the second embodiment is not capable of reducing the difference between the peak value of common mode noise propagating through the conductor lines 3 and 4 and the peak value of an injection signal injected to the conductor lines 3 and 4 through the path different from the conductor lines 3 and 4. Except for this, however, the circuit of the embodiment is capable of reducing common mode noise, base on the principle the same as that of the first embodiment.

In the noise suppressing circuit of the second embodiment, the capacitors 16 and 17 reduce normal mode noise passing through the conductor lines 3 and 4 in cooperation with leakage inductances (the inductors L201 and L202) produced by the windings W11 and W12.

Here is an example in which, in the noise suppressing circuit of the second embodiment, the coupling coefficient of the windings W11 and W12 is 0.95, the inductance of each of the inductors L201 and L202 is 100 μH, and the inductances or capacitances of the other elements are the same as the values used in the simulation of the first embodiment. In this case, the transmission characteristic of the noise suppressing circuit for normal mode signals is the one indicated with numeral 92 of FIG. 15.

In the second embodiment, one of the capacitors 16 and 17 may be omitted as in the first embodiment. The remainder of configuration, operations and effects of the second embodiment are similar to those of the first embodiment.

The present invention is not limited to the foregoing embodiments but may be practiced in still other ways. For example, the shape of the core around which the two windings producing a leakage inductance are wound is not limited to the ones shown in FIG. 7 to FIG. 14. In each of the examples shown in FIG. 7 to FIG. 14, the magnetic path for allowing a leakage flux to pass is a closed magnetic path. However, this magnetic path may form an open magnetic path. Furthermore, the magnetic core preferably incorporates the first magnetic path forming portion that forms the magnetic path allowing a magnetic flux for coupling the two windings to each other to pass, and the second magnetic path forming portion that forms the magnetic path allowing a leakage flux produced by each of the two windings to pass. However, the core may have such a shape that the second magnetic path forming portion is not provided and a leakage flux passes through a space.

In the noise suppressing circuit of the invention, all of the two detection/injection sections and the peak value reducing section may have respective two windings that are coupled to each other. In this case, it is acceptable as long as the two windings of at least one of the two detection/injection sections and the peak value reducing section are coupled to produce a leakage inductance, and the normal mode noise suppressing means is formed through the use of the leakage inductance and the capacitors.

If the noise suppressing circuit of the invention does not incorporate the peak value reducing section, both of the two detection/injection sections may have respective two windings coupled. In this case, it is acceptable as long as the two windings of at least one of the two detection/injection sections are coupled to produce a leakage inductance, and the normal mode noise suppressing means is formed through the use of the leakage inductance and the capacitors.

As thus described, according to the noise suppressing circuit of the invention, it is possible to suppress common mode noise and normal mode noise in a wide frequency range and to achieve a reduction in size of the noise suppressing circuit.

Obviously many modifications and variations of the present invention are possible in the light of the above teachings. It is therefore to be understood that within the scope of the appended claims the invention may be practiced otherwise than as specifically described.

The invention claimed is:

1. A noise suppressing circuit comprising: a common mode noise suppressing means for suppressing common mode noise propagating through a first conductor line and a second conductor line with identical phases; and a normal mode noise suppressing means for suppressing normal mode noise transmitted through the first and second conductor lines and creating a potential difference between the conductor lines, wherein:

the common mode noise suppressing means comprises a first detection/injection section and a second detection/injection section that are connected to the first and second conductor lines at different points and connected to each other through a path different from the first and second conductor lines, and that each perform detection of a signal corresponding to common mode noise or injection of an injection signal for suppressing common mode noise;

when the first detection/injection section performs the detection of the signal corresponding to the common mode noise, the second detection/injection section injects to the first and second conductor lines the injection signal generated based on the signal detected;

when the second detection/injection section performs the detection of the signal corresponding to the common mode noise, the first detection/injection section injects to the first and second conductor lines the injection signal generated based on the signal detected;

at least one of the first and second detection/injection sections incorporates two windings inserted to the first and second conductor lines and coupled to each other so as to produce a leakage inductance; and the normal mode noise suppressing means incorporates two capacitors for a normal mode that are located at positions that sandwich the two windings, each of the two capacitors having an end connected to the first conductor line and the other end connected to the second conductor line, and reducing normal mode noise in cooperation with the leakage inductance produced by the two windings.

2. The noise suppressing circuit according to claim 1, wherein:

the first detection/injection section incorporates: a first winding inserted to the first conductor line at a specific first point; a second winding that is inserted to the second conductor line at a point corresponding to the first point and that suppresses the common mode noise in cooperation with the first winding; and a third winding coupled to the first and second windings;

the second detection/injection section incorporates: a first capacitor for a common mode having an end connected to the first conductor line at a second point different from the first point and having the other end connected to one of ends of the third winding; and a second capacitor for the common mode having an end connected to the second conductor line at a point corresponding to the second point and having the other end connected to the one of the ends of the third winding; and the first and second windings are coupled to each other so as to produce a leakage inductance.

3. The noise suppressing circuit according to claim 2, wherein the common mode noise suppressing means further incorporates a third capacitor for the common mode having an end connected to the one of the ends of the third winding and having the other end grounded.

4. The noise suppressing circuit according to claim 1, further comprising a magnetic core around which the two windings coupled to each other so as to produce the leakage inductance are wound, wherein the core incorporates: a first magnetic path forming portion that forms a magnetic path allowing a magnetic flux for coupling the two windings to each other to pass; and a second magnetic path forming portion that forms a magnetic path allowing a leakage flux produced by each of the two windings to pass.

5. The noise suppressing circuit according to claim 4, wherein the second magnetic path forming portion includes a portion made of a high-permeability magnetic material and a portion made of a magnetic material having high saturation flux density, and forms a closed magnetic path.

6. A noise suppressing circuit comprising: a common mode noise suppressing means for suppressing common mode noise propagating through a first conductor line and a second conductor line with identical phases; and a normal mode noise suppressing means for suppressing normal mode noise transmitted through the first and second conductor lines and creating a potential difference between the conductor lines, wherein:

the common mode noise suppressing means comprises: a first detection/injection section and a second detection/injection section that are connected to the first and second conductor lines at different points and connected to each other through a path different from the first and second conductor lines, and that each perform detection of a signal corresponding to common mode noise or injection of an injection signal for suppressing common mode noise; and a peak value reducing section that reduces a peak value of the common mode noise and is provided on the first and second conductor lines between the first and second detection/injection sections;

when the first detection/injection section performs the detection of the signal corresponding to the common mode noise, the second detection/injection section injects to the first and second conductor lines the injection signal generated based on the signal detected;

when the second detection/injection section performs the detection of the signal corresponding to the common mode noise, the first detection/injection section injects to the first and second conductor lines the injection signal generated based on the signal detected;

at least one of the first and second detection/injection sections and the peak value reducing section incorporates two windings inserted to the first and second conductor lines and coupled to each other so as to produce a leakage inductance; and the normal mode noise suppressing means incorporates two capacitors for a normal mode that are located at positions that sandwich the two windings, each of the two capacitors having an end connected to the first conductor line and the other end connected to the second conductor line, and reducing normal mode noise in cooperation with the leakage inductance produced by the two windings.

7. The noise suppressing circuit according to claim 6, wherein:

the first detection/injection section incorporates: a first winding inserted to the first conductor line at a specific first point; a second winding that is inserted to the second conductor line at a point corresponding to the first point and that suppresses the common mode noise in cooperation with the first winding; and a third winding coupled to the first and second windings;

the second detection/injection section incorporates: a first capacitor for a common mode having an end connected to the first conductor line at a second point different from the first point and having the other end connected to one of ends of the third winding; and a second capacitor for the common mode having an end connected to the second conductor line at a point corresponding to the second point and having the other end connected to the one of the ends of the third winding;

the peak value reducing section incorporates: a fourth winding inserted to the first conductor line at a third point located between the first and second points; and a fifth winding that is inserted to the second conductor line at a point corresponding to the third point and coupled to the fourth winding and that reduces the peak value of the common mode noise between the first and second points in cooperation with the fourth winding; and at least one of a pair of the first and second windings and a pair of the fourth and fifth windings are coupled to each other so as to produce a leakage inductance.

8. The noise suppressing circuit according to claim 7, wherein the common mode noise suppressing means further incorporates a third capacitor for the common mode having an end connected to the one of the ends of the third winding and having the other end grounded.

9. The noise suppressing circuit according to claim 6, further comprising a magnetic core around which the two windings coupled to each other so as to produce the leakage inductance are wound, wherein the core incorporates: a first magnetic path forming portion that forms a magnetic path allowing a magnetic flux for coupling the two windings to each other to pass; and a second magnetic path forming portion that forms a magnetic path allowing a leakage flux produced by each of the two windings to pass.

10. The noise suppressing circuit according to claim 9, wherein the second magnetic path forming portion includes a portion made of a high-permeability magnetic material and a portion made of a magnetic material having high saturation flux density, and forms a closed magnetic path.

\* \* \* \* \*